United States Patent
Chiu

(10) Patent No.: US 8,353,404 B2
(45) Date of Patent: Jan. 15, 2013

(54) POD WITH GUIDING-LOCKING PIECE THEREIN

(75) Inventor: Ming-Lung Chiu, New Taipei (TW)

(73) Assignee: Gudeng Precision Industrial Co, Ltd., New Taipei (TW)

( * ) Notice: Subject to any disclaimer, the term of this patent is extended or adjusted under 35 U.S.C. 154(b) by 22 days.

(21) Appl. No.: 13/110,211

(22) Filed: May 18, 2011

(65) Prior Publication Data

US 2011/0215029 A1    Sep. 8, 2011

Related U.S. Application Data

(62) Division of application No. 11/521,310, filed on Sep. 15, 2006.

(30) Foreign Application Priority Data

Mar. 28, 2006 (TW) ............................... 95205174 U

(51) Int. Cl.
*B65D 85/00* (2006.01)
(52) U.S. Cl. ....................................... 206/710; 206/454
(58) Field of Classification Search ............... 206/710, 206/711, 832, 454, 456, 305; 355/75
See application file for complete search history.

(56) References Cited

U.S. PATENT DOCUMENTS

| | | | |
|---|---|---|---|
| 2,246,470 A * | 6/1941 | McArn et al. ............ | 292/256.71 |
| 5,944,210 A | 8/1999 | Yetter et al. | |
| 2005/0056441 A1 * | 3/2005 | Rider et al. ................. | 174/35 R |
| 2005/0200829 A1 * | 9/2005 | Chiu ............................... | 355/75 |
| 2006/0266011 A1 * | 11/2006 | Halbmaier et al. .......... | 55/385.6 |
| 2007/0085992 A1 * | 4/2007 | Chiu ............................... | 355/75 |

* cited by examiner

*Primary Examiner* — Jacob K Ackun
*Assistant Examiner* — Jenine Pagan
(74) *Attorney, Agent, or Firm* — Ming Chow; Sinorica, LLC

(57) ABSTRACT

The present invention discloses a pod which includes a lower cover member, an upper cover member and a guiding locking piece. The guiding locking piece deployed on one side of the upper cover member of pod, the overall structure of which is formed by a flat base linking to a first slope that links to a second slope, two openings deployed on two side areas of the overall structure, and an upper locking piece and a lower locking piece deployed in each of two openings. When the mask is placed into the lower cover member of pod and is covered by the upper cover member, the mask is pushed to certain position and supported and locked by the upper locking piece and the lower locking piece.

13 Claims, 9 Drawing Sheets

POD WITH GUIDING-LOCKING PIECE THEREIN

CROSS-REFERENCES TO RELATED APPLICATIONS

This application is a divisional application of U.S. patent application Ser. No. 11/521,310 filed Sep. 15, 2006 which claims a foreign priority to Taiwan Patent Application No. 095205174, filed Mar. 28, 2006, the contents of which are hereby incorporated by reference in their entirety.

BACKGROUND OF THE INVENTION

1. Field of the Invention

The present invention relates to a guiding locking piece, and more particularly, to a locking piece used in pod for locking and supporting the mask.

2. Description of the Prior Art

In the process of wafer fabrication in advanced foundries or semiconductor Fabs at present era, yield rate decides whether a semiconductor Fab. profits or not. Therefore managing to enhance the yield rate becomes the most important topic for managers. Among the ways to enhance the yield rate, SMIF system is used to reduce particle contamination during the storing and transporting process of wafer fabrication.

In the prior art, as shown in FIG. 1 and FIG. 2, a common pod 10 comprises upper and lower cover members 11 and 12, wherein two support devices 13 are set up opposite to each other on two sides of the lower cover member 12 and said support devices 13 comprises several stoppers 14 and holders 15 deploying on them. In addition, a restricting device 16 is further deployed on one of the adjacent sides of two opposite support devices 13 and transforms the structure of lower cover member 12 into the shape of an upside-down U with two support devices 13 and an adjacent restricting device 16. Therefore, when a mask is put into lower cover member 12, the structure shaped like an upside-down U can lock and support the mask.

When upper and lower cover members 11 and 12 of pod 10 cover a mask, stoppers 14 and holders 15 deployed on support devices support the brim of the mask. But due to the gap between the upper and lower cover members 11 and 12, displacement will occur along the direction of the side that has no restricting device, i.e. the opening of the upside-down U shaped structure. Thus, not only the duration of mask is reduced due to its adhesive wear caused by adhering support devices 13 and restricting device 14, but the yield rate is also reduced due to the particles caused by friction.

Concerning the defects of the prior art, the present invention provides a structure of guiding locking piece that not only facilitates the leading of mask into pod, but also effectively locks the mask and thus extends the duration of the mask, reduces friction between mask and pod, and prevents the yield rate from being reduced by particle contamination.

SUMMARY OF THE INVENTION

The present invention first provides a guiding locking piece that is deployed on one side of the body of pod, the overall structure of which being formed by a flat base linking to a first slope that links to a second slope, two first openings being deployed on two side areas of the overall structure, and an upper locking piece and a lower locking piece being deployed in each of said first openings, or at least a leading track being further set up near the central area of the overall structure. Moreover, the guiding locking piece can be formed as a one-piece structure.

The present invention then provides a pressing buckle locked in each corner of upper and lower cover members of pod by a base body and two supporting points and also a bent, flexible piece, one bent pole of which being connected with the base body and the other bent pole being positioned between two supporting points in flexible floating condition. The pressing buckle further comprises a top supporting surface and a pressing buckling surface, wherein the top supporting surface and pressing buckling surface of the bent, flexible piece contacting the mask and being locked when the upper and lower cover members of pod cover a mask. Moreover, the pressing buckle can be formed as a one-piece structure or with the combination of separate pieces such as the base body and the bent, flexible piece.

The present invention further provides a pod structure, comprising an upper and lower cover members which can be operatively opened or closed, a support device being deployed on two sides of the lower cover member and comprising a stopper and a holder and a restricting device being deployed on one side adjacent to the support device to form a structure in the shape of an upside-down U; and a guiding locking piece with a flat base linking to a first slope linking to a second slope in order to form an overall structure, two openings being deployed on two side areas of the overall structure and a removable upper locking piece and a removable lower locking piece being deployed in each of said openings on one side of the upper cover member opposite to the opening of the structure shaped like an upside-down U. With this structure, when a mask is placed into said lower cover member, said mask is supported and locked in the lower cover member by the stopper and the holder, and when the upper and lower cover members of pod cover the mask, said mask is readily led by the second slope of guiding locking piece to a proper, unshakable position and contacted and locked by upper locking piece and lower locking piece.

The present invention further provides a pod structure comprising the pod structure said above and the upper cover member of the pod being added with a plurality of pressing buckles, which are fixed to the corners of the upper cover member through a plurality of supporting points and comprise a top supporting surface and a pressing buckling surface. When a mask is placed into a lower cover member, said mask is supported and locked in the lower cover member by the stopper and the holder of the support device. When the upper and lower cover members of said pod cover the mask, said mask is readily led by the second slope of guiding locking piece to a proper, unshakable position and contacted and locked by the upper locking piece, the lower locking piece, and the top supporting surface and pressing buckling surface of the pressing buckle.

With the design provided by the present invention, the mask can be easily led into the pod and effectively locked so that the duration of mask can be extended, the friction between the mask and pod can be reduced, the particle contamination that influences the yield rate can be reduced, and the effects of protecting the mask and avoiding particle contamination can be achieved.

DETAILED DESCRIPTION OF THE PREFERRED EMBODIMENTS

The present invention discloses a structure of guiding locking piece used in pod and the masks or pods used in the invention have been disclosed in detail in the prior art; therefore in the following description, they will not be fully described. Moreover, the diagrams included in the following are not completely drawn according to the real size and are only used to demonstrate features related to the present invention.

Figure 3:
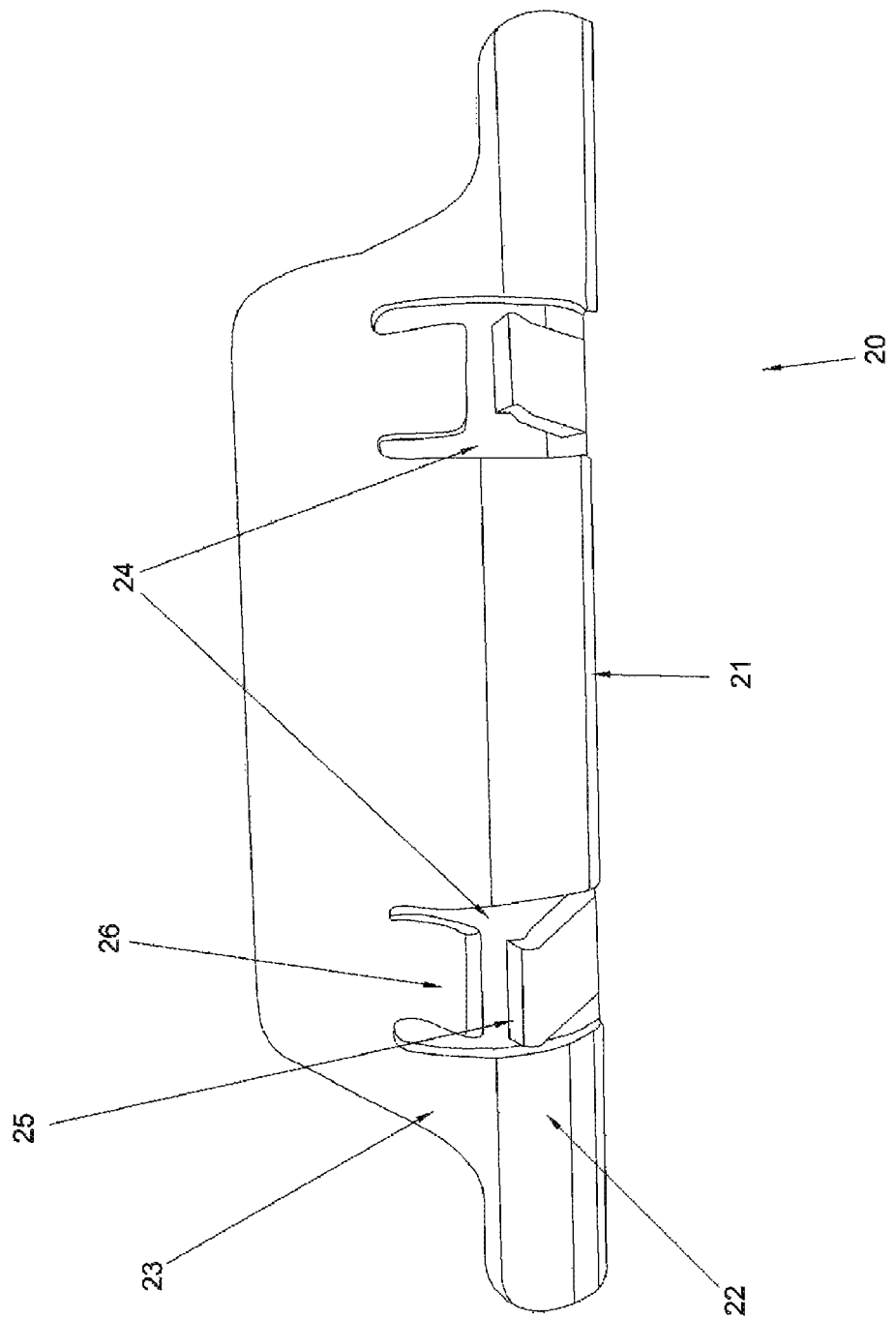
FIG. 3 is a front view of the structure of guiding locking piece of the present invention.

First of all, FIG. 3 is a diagram of the guiding locking piece 20 of the present invention deployed in the body of pod. The guiding locking piece 20 in FIG. 3 is formed as a one-piece structure, the structure of which comprises at least a flat base 21 linking to a first slope 22, said first slope 22 linking further to a second slope 23 to form an overall structure. What should be emphasized here is that, in the present invention, there is no restriction concerning first slope 22 and second slope 23. Wherein an angle close to 90 degrees is formed between first slope 22 and flat base 21 and of course, said angle can be adjusted in different embodiments. And there is also another angle formed between second slope 23 and first slope 22, the purpose of which is to provide a smooth slidable surface.

Two first openings 24 are then deployed on two side areas of the overall structure of guiding locking piece 20 and an upper locking piece 25 and a lower locking piece 26 are further deployed in each of first openings 24. When a mask is placed in lower cover member 12 of pod 10, in the covering process of upper cover member 11 and lower cover member 12, the mask can be smoothly led into a proper and unshakable position in pod 10 by the pushing of guiding locking piece 20 and second slope 23 and supported and locked by upper locking piece 25 and lower locking piece 26.

Figure 4:
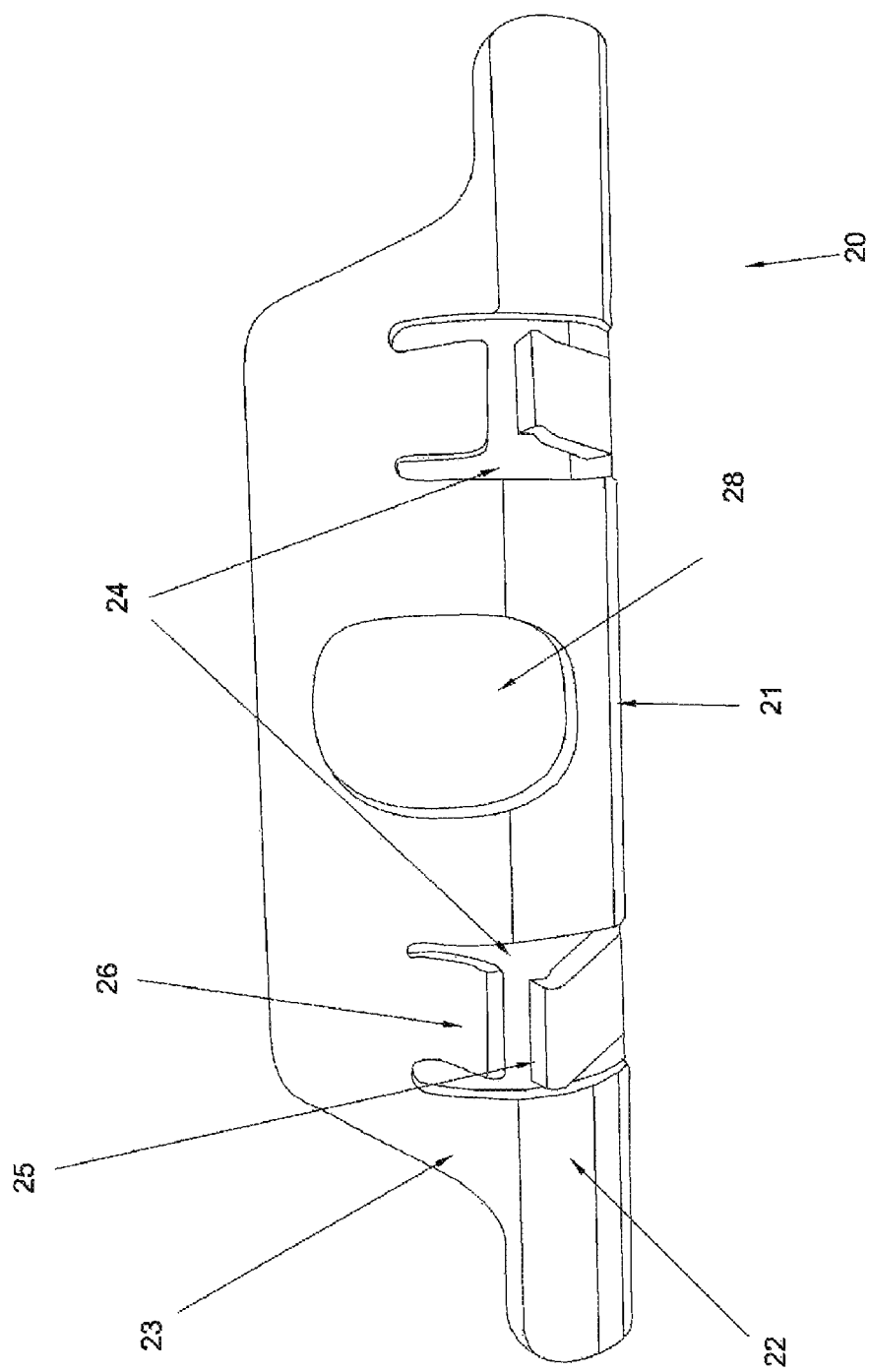
FIG. 4 is a front view of another preferred embodiment of the structure of guiding locking piece of the present invention.
Figure 5:
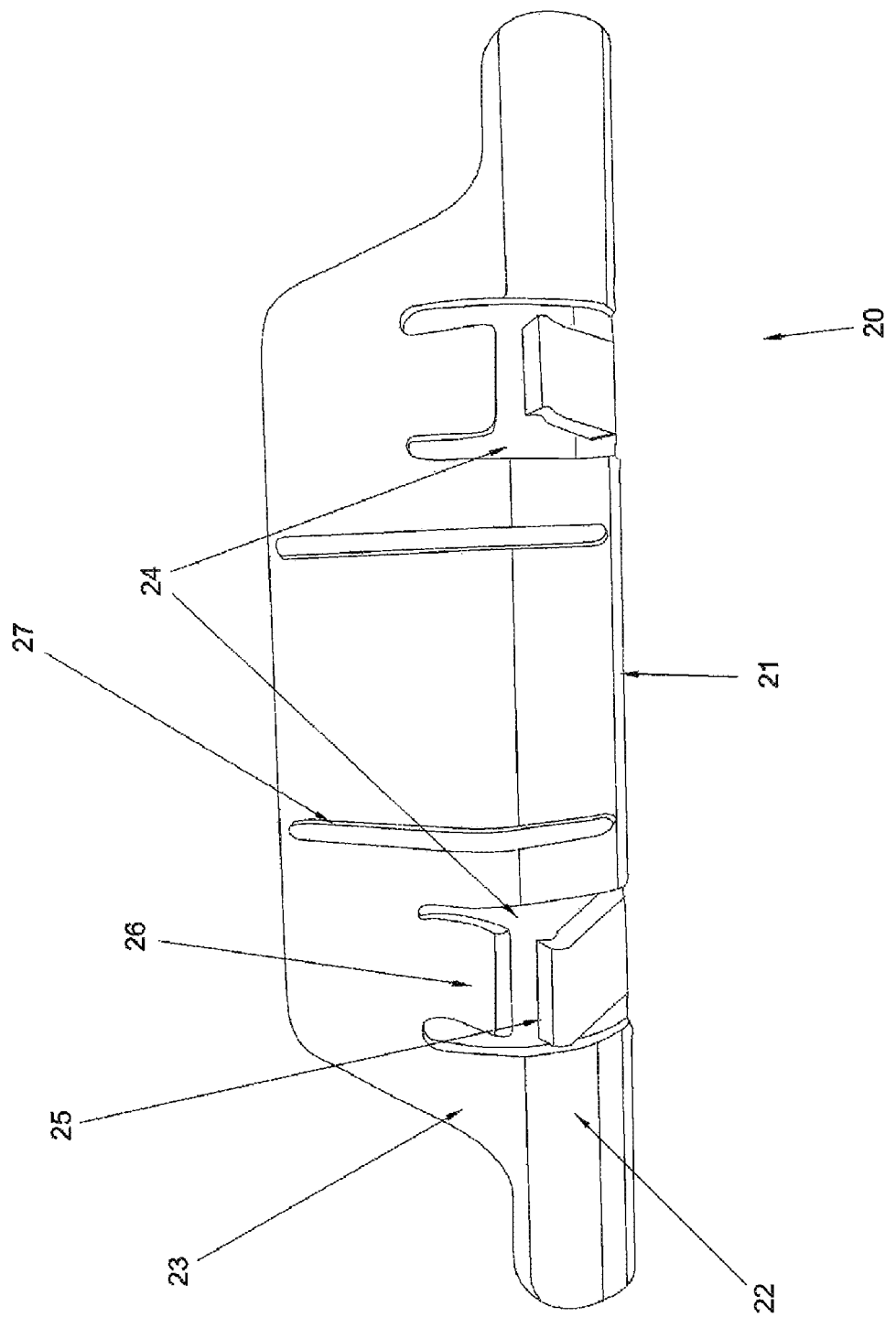
FIG. 5 is a front view of still another preferred embodiment of the structure of guiding locking piece of the present invention.
Figure 6:
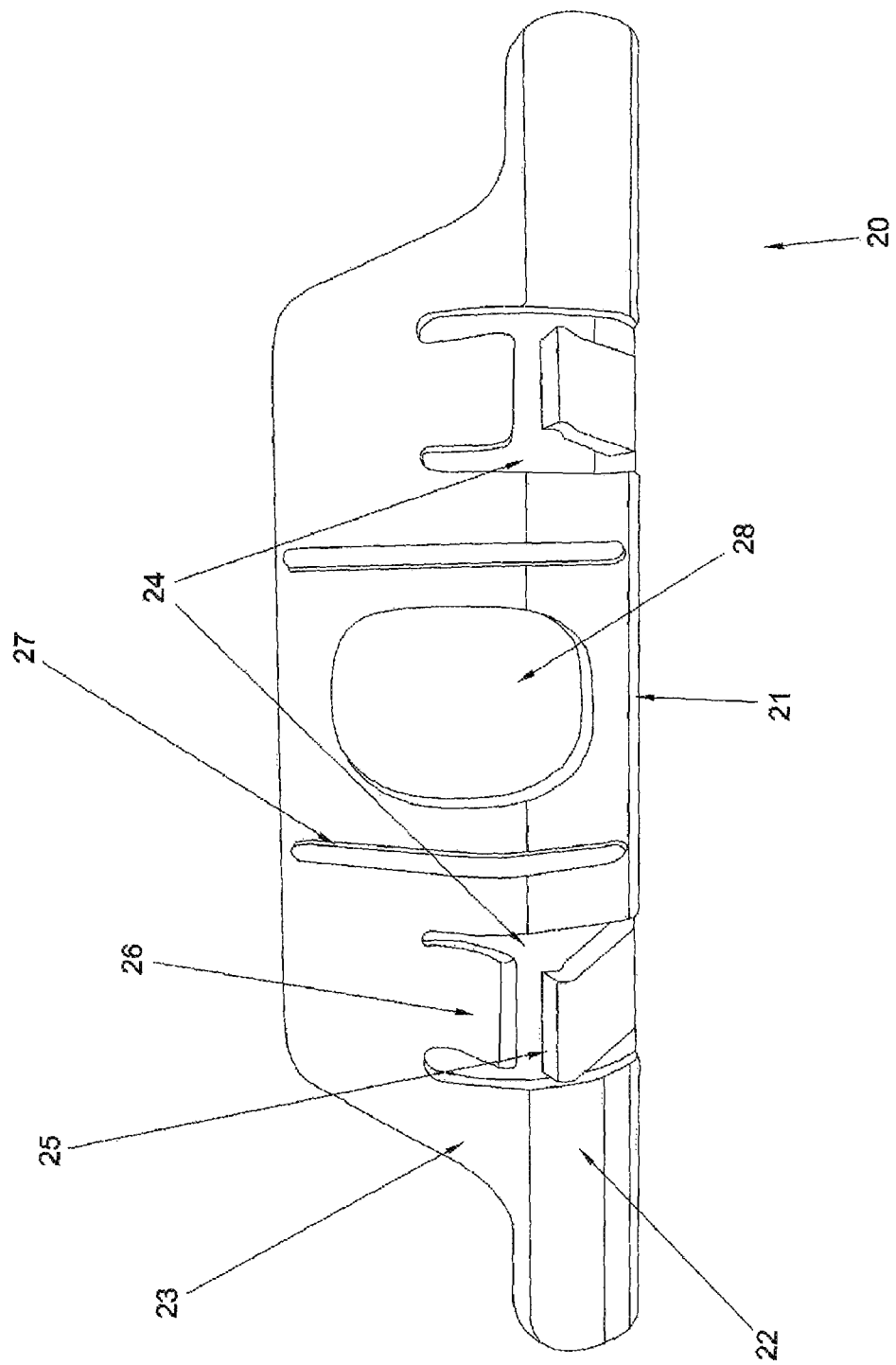
FIG. 6 is a front view of yet another preferred embodiment of the structure of guiding locking piece of the present invention.
Figure 7:
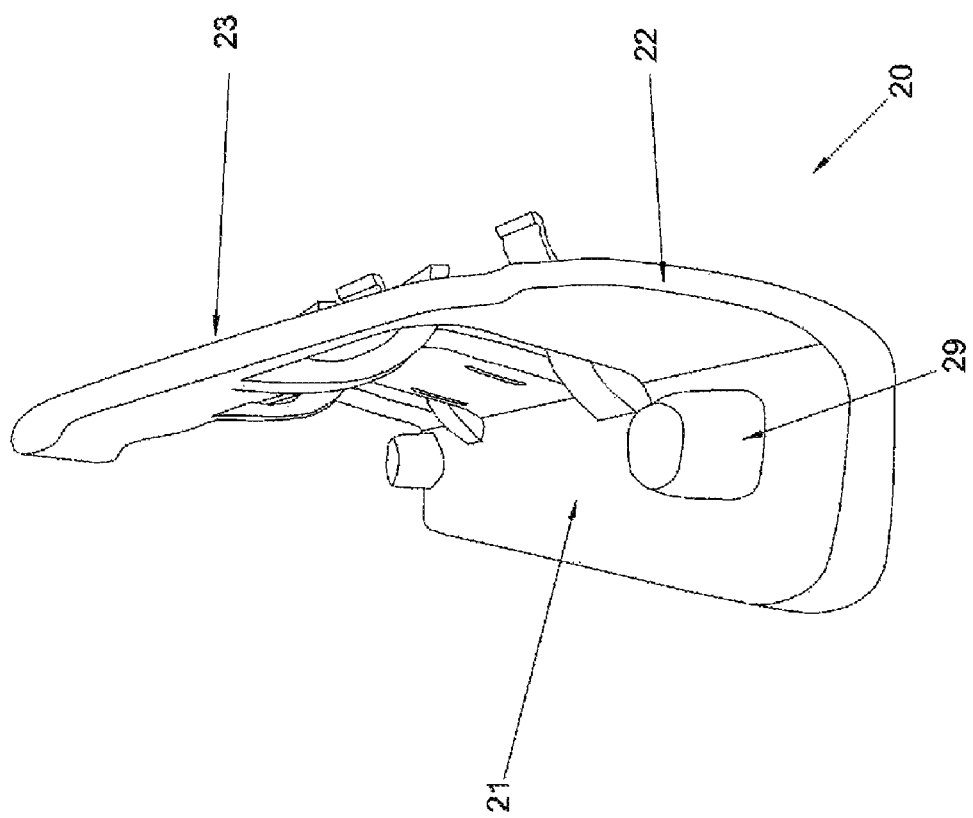
FIG. 7 is a side view of the structure of guiding locking piece of the present invention.

Please then refer to FIG. 4, which is another embodiment of the present invention, its feature being the further deployment of a second opening 28 in the central area of the overall structure of guiding locking piece 20 in the embodiment described above and the deployment of said second opening 28 being able to be set in the central area of the overall structure or being increased into a plurality of openings on second slope 23 according to different embodiments. With the design of this second opening 28, the contact surface area between the mask and guiding locking piece 20 can be reduced, and thus the percentage of producing particles can also be reduced. Please then refer to FIG. 5 and FIG. 6, which demonstrate still another embodiment of guiding locking piece 20 provided by the present invention, its feature being the deployment of at least one leading track 27 near the central area and simultaneously on the two sides of second opening 28 matching the position of the opening. One of the purposes of this design of leading track 27 is to further reduce the contact surface area between the mask and guiding locking piece 20 during the contact and gliding to increase the yield rate of the fabrication process. Furthermore, in order to lock the guiding locking piece 20 in the upper cover member 11 of pod 10, a pair of connecting pieces 29 is set up on the two side areas of the base area of flat base 21 of guiding locking piece 20 in order to lock the guiding locking piece 20 on one side of the upper cover member 11, as shown in FIG. 7. The guiding locking piece 20 can be fabricated using polymer material or a kind of flexible material.

Figure 8:
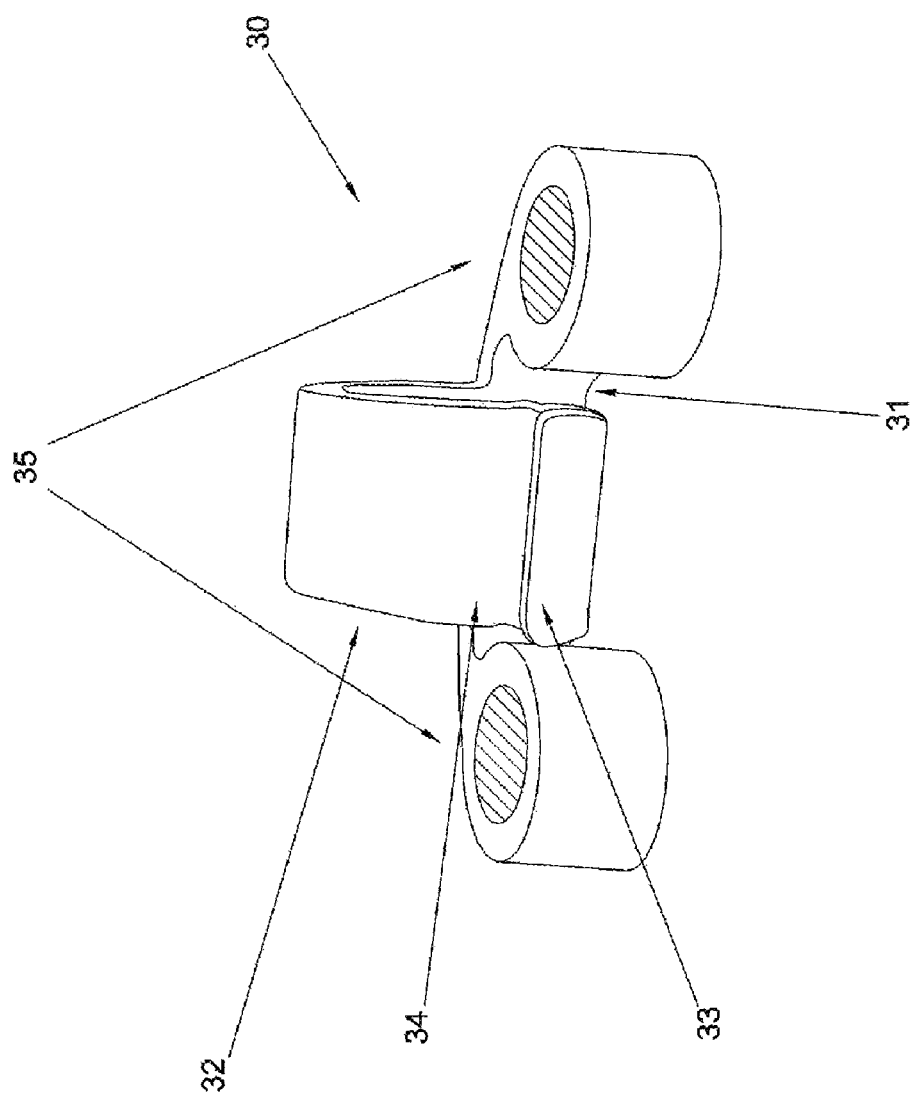
FIG. 8 is a block diagram illustrating the structure of pressing buckle of the present invention.
Figure 9:
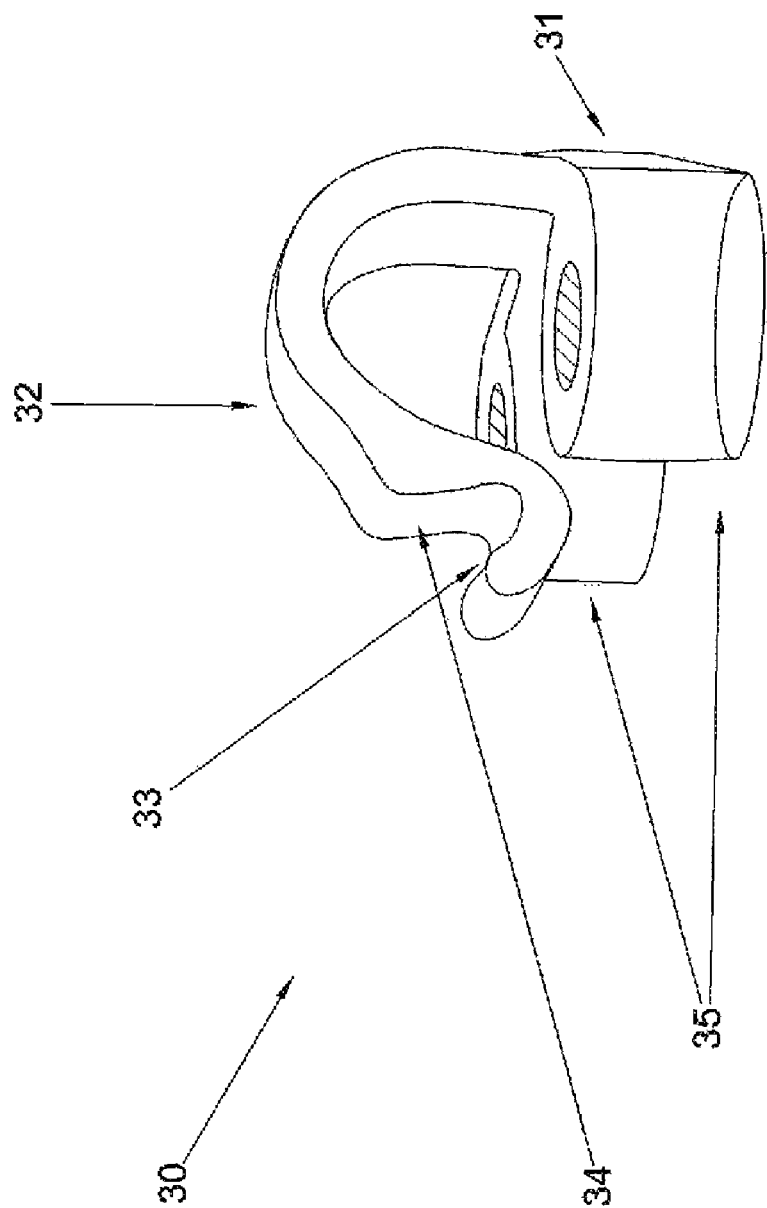
FIG. 9 is a side view of the structure of pressing buckle of the present invention.

And then, please refer to FIG. 8, FIG. 8 is a diagram of the structure of pressing buckle 30 locked in the upper cover 15 member 11 of pod 10 provided by the present invention. The pressing buckle 30 in FIG. 8 comprises a base body 31, on which are deployed one or a plurality of supporting points 35 in order to lock base body 31 to each corner of the upper cover member 11 of 20 pod 10; moreover, a bent, flexible piece 32 is connected with base body 31, one pole of the bent, flexible piece 32 being fully extended out of the base body 31 and the other pole being positioned between the one or a plurality of supporting points 35 in flexible floating condition; said bent, flexible piece 32 is further equipped with the design of a pressing buckling surface 33 and a top supporting surface 34 so that when the upper cover member 11 and lower cover member 12 of pod 10 cover a mask, the pressing buckling surface 33 and top supporting surface 34 of this bent, flexible piece 32 can contact, snap-fit, and lock the mask. Furthermore, the one or a plurality of supporting points 35 on pressing buckle 30 of the present invention can be designed as being deployed with an angle that can be adjusted in different embodiments and the present invention uses a plurality of supporting points for illustration. Moreover, the pressing buckle 30 can be 10 fabricated using polymer material and a removable pressing buckle 30 can be connected with the upper cover member 11 of pod 10.

The above is a detailed description of the structure of guiding locking piece 20 and pressing buckle 30 of the present invention. In the following, the combination and usage of guiding locking piece 20 and pressing buckle 30 in a pod 10 will be described.

Figure 1:
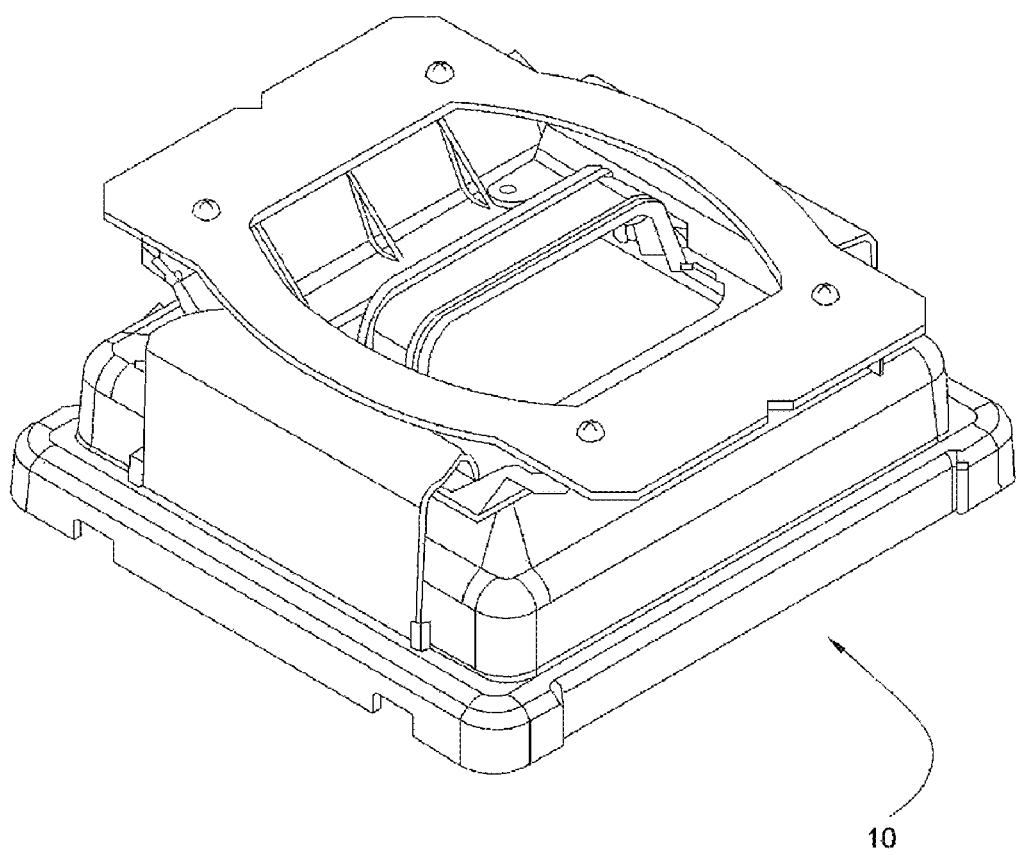
FIG. 1 is a block diagram illustrating a pod in the prior art.
Figure 2:
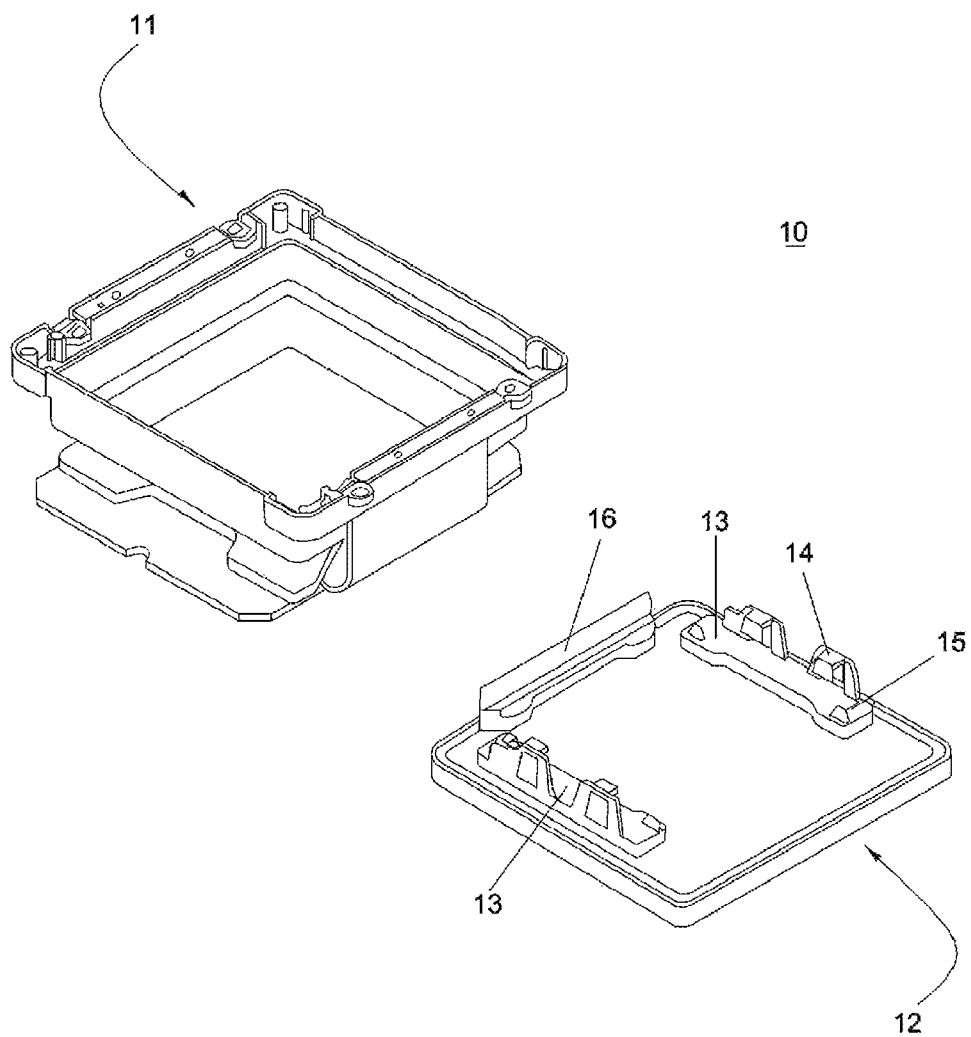
FIG. 2 is a decomposition diagram illustrating a pod in the prior art.

In a preferred embodiment of the present invention, please refer to FIG. 2, in FIG. 2, the pod 10 comprises an upper and a lower cover member 11 and 12 that can be operated to open or close, wherein a support device 13 is deployed respectively on the two sides of the lower cover member 12 of pod 10, a restricting device 16 is deployed in any of the adjacent sides between two sides to form a structure shaped like an upside-down U, and several stoppers 14 and several holders 15 are deployed on the support device 13. In order to reduce the impact or vibration produced during the process in which the upper and lower cover member 11 and 12 of pod 10 cover a mask, stabilize and protect the mask in the pod, avoid particle contamination, and achieve sealing on all four sides with pressing and buckling, a guiding locking piece 20 can be further added on one side of the upper cover member 11 of pod 10 provided by the present invention and this side is opposite to the opening side of the structure shaped like an upside-down U of the lower cover member 12. With this deployment, when the upper and lower cover members 11 and 12 of pod 10 cover a mask, a quasi-closed structure can be formed and the mask can be readily led into the pod with the second slope 23 of guiding locking piece 20 and supported and locked by the upper locking piece 25 and lower locking piece 26.

Moreover, in order to further stably lock the mask in the pod, in another preferred embodiment of the present invention, please refer 15 to FIG. 8, a plurality of pressing buckles 30 are deployed on four corners of the upper cover member 11 and one or a plurality of removable supporting points 35 on base body 31 are locked to each corner of the upper cover member 11. Therefore, a plurality of pressing buckling surfaces 33 and top supporting surfaces 34 can be further provided as locking and supporting points. When the mask is placed in the lower cover member 12 of pod 10, the mask will be supported by a plurality of stoppers 14 and holders 15 and locked to the lower cover member 12 due to the restriction of restricting device 16. When the upper cover member 11 covers, since the opening side of the structure shaped like an upside-down U of the upper cover member 11 opposite to the lower cover member 12 is deployed with guiding locking piece 20, the mask can be pushed by the second slope 23 on the guiding locking piece 20 to the locking position shaped like an upside-down U; simultaneously, since each corner of the upper cover member 11 is deployed with a plurality of pressing buckles 30, when the mask is pushed to the locking position by the second slope 23 on the guiding locking piece 20, it will also be supported and locked by the upper locking piece 25 and lower locking piece 26 on the guiding locking piece 20 10 and the pressing buckling surfaces 33 and top supporting surfaces 34 of the flexible piece 32 on the plurality of pressing buckles 30.

What are described above are only preferred embodiments of the present invention and should not be used to limit the claims of the present invention; moreover, the above description can be understood and put into practice by those who are skilled in the present technical field, therefore equivalent changes or modifications made without departing from the spirit disclosed by the present invention should still be included in the appended claims.

What is claimed is:

1. A pod structure, comprising
   a lower cover member, two sides of which being deployed with a support device and a restricting device being deployed in any of the adjacent sides between two sides of said lower cover member of said pod structure to form a structure with an inverse U shaped, and a plurality of stoppers and a plurality of holders being deployed on said support device;
   an upper cover member, which can be operated to open or close with said lower cover member;
   a plurality of pressing buckles, being locked at the position of each corner of said upper cover member by a plurality of supporting points and further comprising a top supporting surface and a pressing buckling surface; and
   a guiding locking piece, being deployed on an inner surface of one side of said upper cover member of said pod structure opposite to an opening side of said structure with an inverse U shaped, said guiding locking piece having a flat base linking to a first slope and said first slope further linking to a second slope to form an overall structure of said guiding locking piece, two openings being further deployed on two side areas of said overall structure of said guiding locking piece and an upper locking piece and a lower locking piece being deployed in each of said two openings to support and lock a mask;
   wherein when a mask is placed into said lower cover member of said pod structure, said mask being supported and locked in said lower cover member by said plurality of stoppers and said plurality of holders, and when said upper cover member of said pod structure covers said mask, said mask being led into said pod structure with said second slope of said guiding locking piece and supported and locked by said upper locking piece and said lower locking piece.

2. The pod structure according to claim 1, wherein said pressing buckle comprising:
   a base body, locked to the position of each corner in said upper cover member of said pod by a plurality of supporting points; and
   a bent, flexible piece, one bent pole of which being connected with said base body and the other bent pole being positioned between said one or a plurality of supporting points in flexible floating condition and further comprising a top supporting surface and a pressing buckling surface;
   wherein when said pod covers a mask, said top supporting surface and said pressing buckling surface of said bent, flexible piece contacting and locking said mask.

3. The pod structure according to claim 2, wherein one or a plurality of supporting points of said base body is deployed at an angle.

4. The pod structure according to claim 2, wherein said pressing buckle is removable through said one or a plurality of supporting points.

5. The pod structure according to claim 1, wherein said pressing buckle is fabricated using a polymer material.

6. The pod structure according to claim 1, wherein said guiding locking piece is fabricated using a polymer material.

7. The pod structure according to claim 1, wherein at least one leading track is deployed near central area of second slope of said guiding locking piece.

8. The pod structure according to claim 1, wherein said guiding locking piece further comprises a second opening deployed at central area of said overall structure.

9. The pod structure according to claim 1, wherein said guiding locking piece further comprises a plurality of second openings deployed on said second slope.

10. The pod structure according to claim 1, wherein said guiding locking piece further comprises a connecting piece deployed on two side areas of base area of said flat base.

11. The pod structure according to claim 1, wherein an angle is located between said second slope and said first slope of said guiding locking piece.

12. The pod structure according to claim 1, wherein at least one leading track is deployed near central area of said guiding locking piece.

13. The pod structure according to claim 1, wherein said pressing buckle is removable through said one or plurality of supporting points.

* * * * *